United States Patent
Thelen, Jr.

(10) Patent No.: US 10,038,447 B2
(45) Date of Patent: Jul. 31, 2018

(54) METHOD OF FORMING A SEMICONDUCTOR DEVICE AND STRUCTURE THEREFOR

(71) Applicant: SEMICONDUCTOR COMPONENTS INDUSTRIES, LLC, Phoenix, AZ (US)

(72) Inventor: Donald Claude Thelen, Jr., Bozeman, MT (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 218 days.

(21) Appl. No.: 15/232,248

(22) Filed: Aug. 9, 2016

(65) Prior Publication Data

US 2017/0047910 A1 Feb. 16, 2017

Related U.S. Application Data

(60) Provisional application No. 62/203,675, filed on Aug. 11, 2015.

(51) Int. Cl.
*H03K 5/00* (2006.01)
*H03K 19/20* (2006.01)
*H03K 5/24* (2006.01)

(52) U.S. Cl.
CPC ........... *H03K 19/20* (2013.01); *H03K 5/2481* (2013.01)

(58) Field of Classification Search
CPC .............................. H03K 19/20; H03K 5/2481
USPC ......... 327/97, 68, 50, 51, 52, 54, 55, 56, 57
See application file for complete search history.

(56) References Cited

U.S. PATENT DOCUMENTS

| | | | | |
|---|---|---|---|---|
| 5,272,393 A | * | 12/1993 | Horiguchi | H03K 17/693 327/306 |
| 5,625,308 A | * | 4/1997 | Matsumoto | H03K 3/356034 327/203 |
| 6,028,455 A | * | 2/2000 | Yamauchi | H04L 25/0272 327/201 |
| 6,590,805 B2 | * | 7/2003 | Lu | G11C 11/15 327/52 |
| 6,888,444 B1 | * | 5/2005 | Yamauchi | H04L 25/0272 327/50 |
| 8,456,197 B2 | * | 6/2013 | Dubey | H04L 25/0274 324/123 R |
| 2002/0118048 A1 | | 8/2002 | Kulhalli et al. | |
| 2002/0171387 A1 | | 11/2002 | Stancu et al. | |
| 2007/0182458 A1 | * | 8/2007 | Park | G11C 7/065 327/51 |
| 2009/0219056 A1 | * | 9/2009 | Hsiung | H03K 5/082 327/34 |

(Continued)

*Primary Examiner* — Thomas Skibinski
(74) *Attorney, Agent, or Firm* — Robert F. Hightower

(57) ABSTRACT

In one embodiment, a semiconductor device may include forming a first inverter and a second inverter to selectively receive separate inputs of a differential input signal and directly connecting each of the first and second inverters to receive power directly from a voltage input and a voltage return. The first inverter may be configured to include a first control switch that is configured to selectively couple together an upper transistor and a lower transistor of the first inverter. The second inverter may be configured to include a second control switch that is configured to selectively couple together an upper transistor and a lower transistor of the second inverter.

20 Claims, 8 Drawing Sheets

(56) References Cited

U.S. PATENT DOCUMENTS

2016/0087607 A1*  3/2016  Rajaee ................. H03K 5/2481
                                                327/97
2016/0254806 A1*  9/2016  Chong ................. H03K 5/2481
                                                327/52
2017/0047937 A1*  2/2017  Thelen, Jr. ............ H03M 1/124

* cited by examiner

METHOD OF FORMING A SEMICONDUCTOR DEVICE AND STRUCTURE THEREFOR

PRIORITY CLAIM TO PRIOR PROVISIONAL FILING

This application claims priority to prior filed Provisional Application No. 62/203,675 entitled "A DUAL DIFFERENTIAL LATCH COMPARATOR" filed on Aug. 11, 2015, and having common inventor Donald Claude Thelen, Jr which is hereby incorporated herein by reference.

CROSS-REFERENCE TO RELATED APPLICATIONS

This application is related to an application entitled "METHOD OF FORMING AN AMPLIFIER AND STRUCTURE THEREFOR", having a common assignee, and inventor Donald Claude Thelen, Jr. which is filed concurrently herewith and which is hereby incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form differential comparators. The differential comparators had many different types of applications such as a portion of an analog-to-digital converter. The differential comparators would receive a differential input signal and compare it to a differential reference voltage and form a digital output. Some of the differential comparators used multiple clock phases, such as for example three or more clock phases, to perform the conversion from the analog input signal to the digital output. The multiple phases often caused delays in the amount of time utilized to perform the comparison.

Some of the differential comparators utilized a parasitic capacitor for the conversion process. Often, the parasitic capacitor did not effectively store the value of the received signal which caused errors in the conversion process. Additionally, circuits on the output of the differential comparator often resulted in errors in the conversion process.

Accordingly, it is desirable to have a differential comparator that operates from fewer clock phases, or that more effectively stores the value of the received signal, or that may compensate for capacitive loading from an output circuit.

Figure 1:
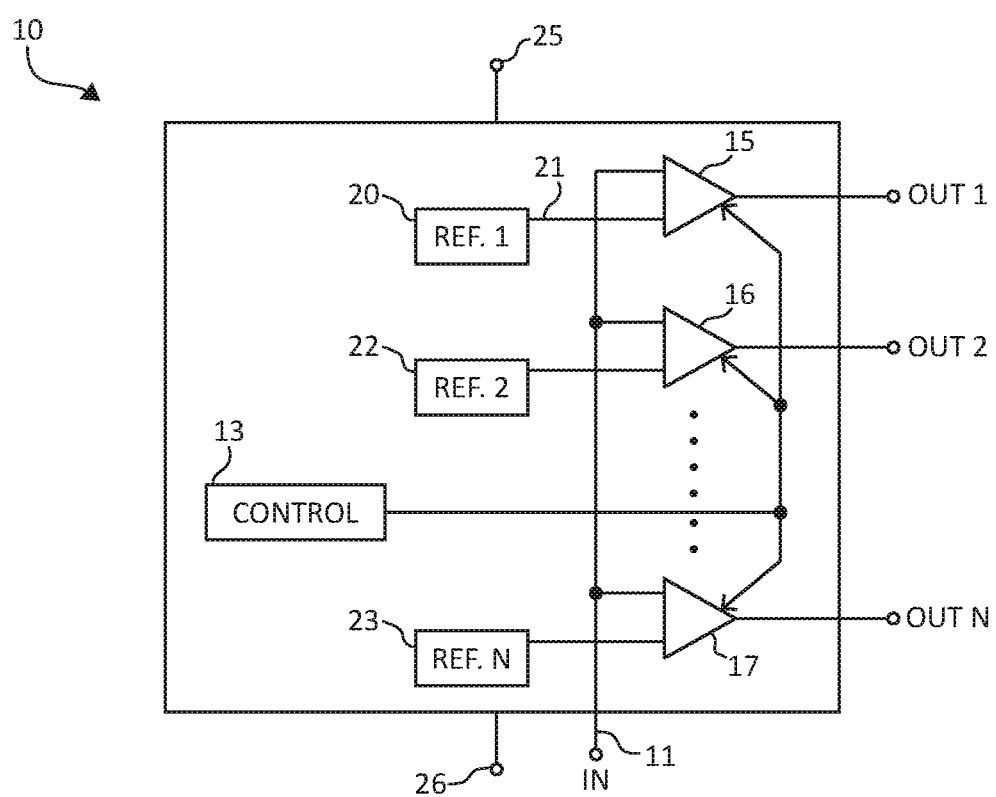
FIG. 1 schematically illustrates an example of an embodiment of a system 10 that includes a plurality of differential comparators in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted"

means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments.

The embodiments illustrated and described hereinafter suitably may have embodiments and/or may be practiced in the absence of any element which is not specifically disclosed herein.

DETAILED DESCRIPTION OF THE DRAWINGS

FIG. 1 schematically illustrates an example of an embodiment of a system 10 that includes a plurality of differential comparators, such as for example differential comparators 15, 16, and 17. Comparator 15 receives power for operating system 10 between a voltage input 25 and a common voltage return 26. In an embodiment, an operating voltage for operating comparators 15-17 and other elements of system 10 is applied to system 10 between input 25 and return 26. In one embodiment, comparators 15-17 may be part of an analog-to-digital comparator (ADC) that converts an input signal 11 to a digital value formed by the state of a plurality of digital outputs, such as for example outputs OT1-OTN, that have a digital value representing the value of input signal 11. Those skilled in the art will appreciate that any one of comparators 15-17 have applications in other circuits in addition to the ADC described herein. Although signal 11 is illustrated with a single line, input signal 11 may be a differential signal that has two inputs. In one example embodiment, comparator 15 receives a reference signal 21 from a reference circuit (Ref1) 20. Signal 21 may have an embodiment as a differential reference signal formed on two outputs. An embodiment of comparator 15 may compare the value of input signal 11 to the value of reference signal 21 and assert the output signal OUT1 if the value of input signal 11 is greater than the value of reference signal 21. Comparators 16-17 receive respective reference signals 22-23 that have other reference values that are progressively lower than signal 21 and lower than each other in order to assist in forming the digital value on outputs OT1-OTN. System 10 may also include a control circuit or control 13 that forms control signals to control the operation of comparators 15-17.

Figure 2:
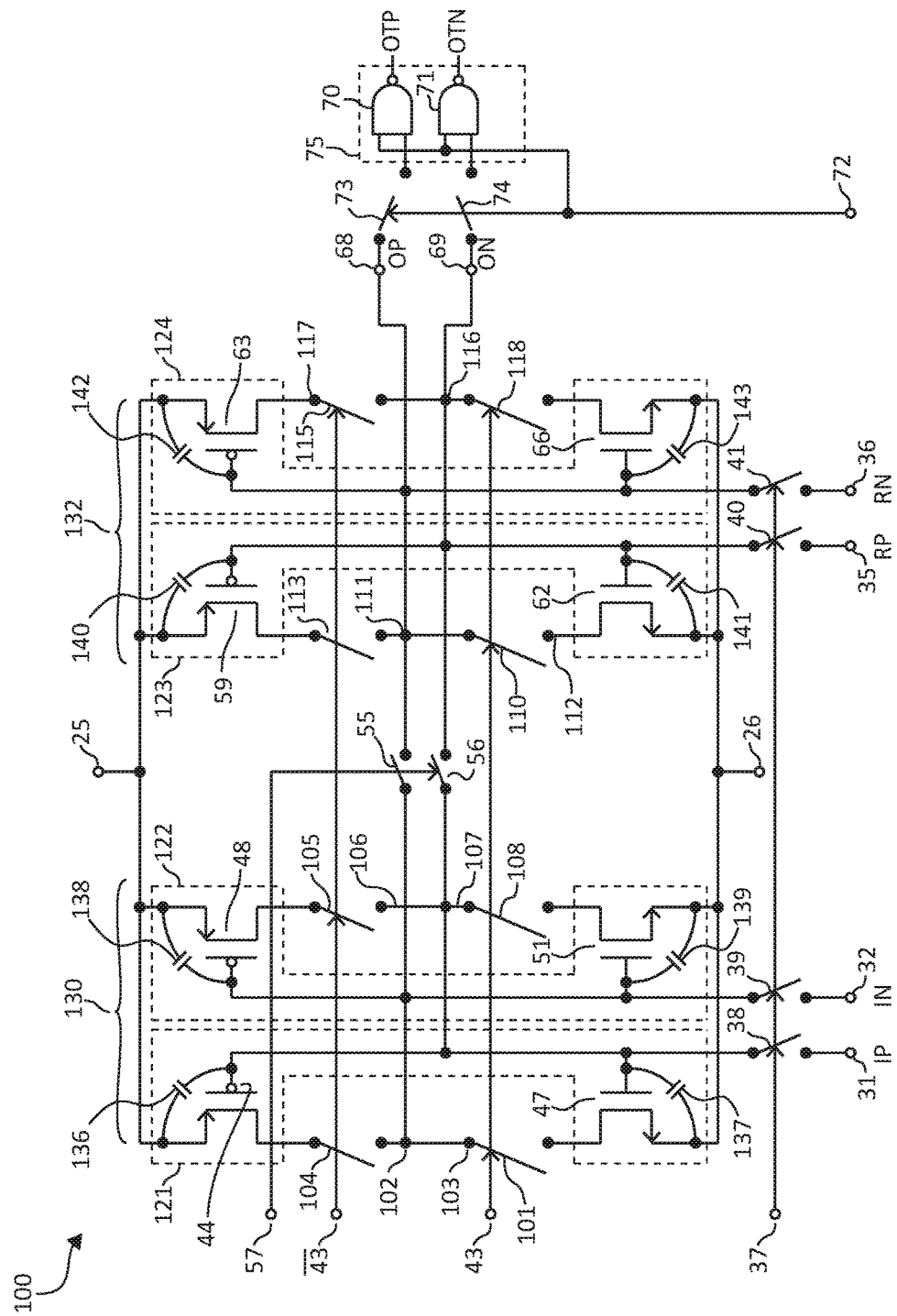
FIG. 2 schematically illustrates an example of an embodiment of a comparator that may be an alternate embodiment of any one of the comparators of FIG. 1 in accordance with the present invention.

FIG. 2 schematically illustrates an example of an embodiment of a comparator 100 that may be an alternate embodiment of any one of comparators 15-17 of FIG. 1. Comparator 100 includes differential signal inputs that are configured to receive a differential input signal having input signals 31 (IP) and 32 (IN), and also has differential reference inputs that are configured to receive a differential reference signal having reference signals 35 (RP) and 36 (RN). Comparator 100 may be configured to compare input signals 31 and 32 to reference signals 35 and 36. In an embodiment, input signal 31 (IP) may have a first amplitude and a first polarity at a given instant in time, and input signal 32 (IN) may have an amplitude that is substantially equal to the first amplitude and a polarity that is substantially opposite to the first polarity. Similarly, an embodiment of reference signal 35 (RP) may have a second amplitude and a second polarity at a given instant in time, and reference signal 36 (RN) may have an amplitude that is substantially equal to the second amplitude and a polarity that is substantially opposite to the second polarity. Reference signals 35 and 36 may have an embodiment of substantially D.C. signals or alternately varying D.C. or alternately A.C. signals.

Comparator 100 may have differential outputs 68 and 69 that form a differential digital output signal that includes a positive output signal OP on output 68 and a negative output signal ON at output 69. Signals OP and ON may have substantially the same amplitude but opposite polarities to each other. A load to comparator 100 may be configured to receive signals OP and ON and form the system output signals OT1P and OT1N. In some embodiments, an output switch 73 may be connected to output 68 and an output switch 74 may be connected to output 69. In an embodiment, switches 73-74 may be selectively controlled to couple the corresponding output signals OP and ON to the load in response to an asserted state of an output transfer signal 72. Switches 73-74 and the input for signal 72 may be a portion of the load that may be connected to comparator 100 or alternately may be a portion of comparator 100.

In an embodiment, comparator 100 may include a first amplifier latch circuit 130 and a second amplifier latch circuit 132. Circuit 130 may have been an embodiment that may include a first selectively switched inverter amplifier or selectively switched inverter 121 and a second selectively switched inverter amplifier or selectively switched inverter 122, and circuit 132 may have an embodiment may include a third selectively switched inverter amplifier or selectively switched inverter 123 and a fourth selectively switched inverter amplifier or selectively switched inverter 124. Comparator 100 may also include transfer switches 55 and 56 that are selectively enabled to transfer signals between circuit 130 and circuit 132. In an embodiment, switches 55 and 56 may be enabled or closed in response to an asserted value of a transfer signal 57 and disabled or open in response to a negated value of signal 57.

Inverter 121 may, in an embodiment, include an upper transistor 44 and a lower transistor 47. In an embodiment, transistor 44 may be a P-channel transistor that has a source connected to input 25 and a gate connected to selectively receive input signal 31 (IP). Transistor 47 may have an embodiment as an N-channel transistor that has a source connected to return 26 and a gate connected to selectively receive input signal 31 (IP). An embodiment may include that a selectively enabled input switch 38 may be connected to the gates of transistors 44 and 47 and may be configured to selectively connect the gates to input signal 31 (IP). In an embodiment, the drain of transistors 44 and 47 may be configured to be selectively connected together by a control switch 101 in response to a control signal 43.

Inverter 122 may, in an embodiment, include an upper transistor 48 and a lower transistor 51. In an embodiment, transistor 48 may be a P-channel transistor that has a source connected to input 25 and a gate connected to selectively receive input signal 32 (IN). Transistor 51 may have an embodiment as an N-channel transistor that has a source connected to return 26 and a gate connected to selectively receive input signal 32 (IN). In an embodiment, the drain of transistors 48 and 51 may be configured to be selectively connected together by a control switch 105 in response to control signal 43. An embodiment may include that a selectively enabled input switch 39 may be connected to the gate of transistors 48 and 51 and may be configured to selectively connect the gates to input signal 32 (IN).

Inverter 123 may have an embodiment that may include an upper transistor 59 and a lower transistor 62. In an embodiment, transistor 59 may be a P-channel transistor that has a source connected to input 25 and a gate connected to selectively receive reference signal 35 (RP). Transistor 62 may have an embodiment as an N-channel transistor that has a source connected to return 26 and a gate connected to selectively receive reference signal 35 (RP). In an embodiment, the drain of transistors 59 and 62 may be configured to be selectively connected together by a control switch 110 in response to control signal 43. An embodiment may include that a selectively enabled input switch 40 may be connected to the gate of transistors 59 and 62 and may be configured to selectively connect the gates to reference signal 35 (RP).

An embodiment of inverter 124 may include an upper transistor 63 and a lower transistor 66. In an embodiment, transistor 63 may be a P-channel transistor that has a source connected to input 25 and a gate connected to selectively receive reference signal 36 (RN). Transistor 66 may have an embodiment as an N-channel transistor that has a source connected to return 26 and a gate connected to selectively receive reference signal 36 (RN). In an embodiment, the drain of transistors 63 and 66 may be configured to be selectively connected together by a control switch 115 in response to control signal 43. An embodiment may include that a selectively enabled input switch 41 may be connected to the gates of transistors 63 and 66 and may be configured to selectively connect the gates to reference signal 36 (RN). In an embodiment, switches 38-41 may be selectively controlled to couple the corresponding input signal or reference signal to comparator 100 in response to an asserted state of a sampling signal 37.

Transistors 44, 48, 59, and 63 each have respective capacitors 136, 138, 140, and 142 directly connected between the gate of the respective transistor and input 25. Similarly, transistors 47, 51, 62, and 66 each have respective capacitors 137, 139, 141, and 143 directly connected between the gate of the respective transistor and return 26. In an embodiment, the set of capacitors 136, 138, 140, and 142 and the set of capacitors 137, 139, 141, and 143 may be parasitic gate-to-source capacitors of respective set of transistors 44, 48, 59, and 63 and set of transistors 47, 51, 62, and 66. In some embodiments, one or more of the capacitors may be separate discrete capacitors or a combination of parasitic and discrete capacitors.

Figure 3:
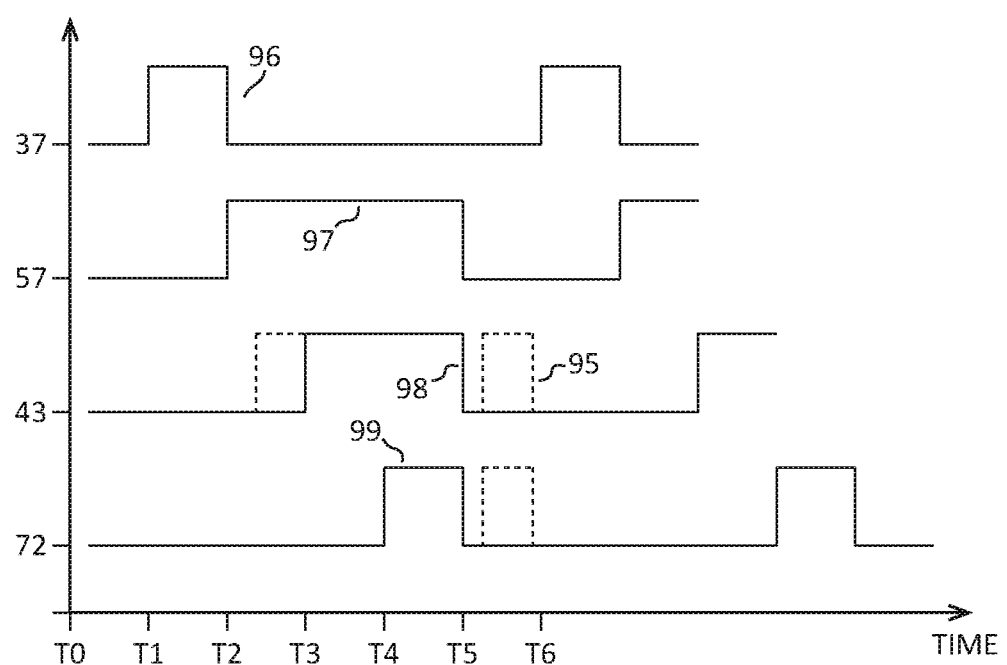
FIG. 3 is a graph having plots that illustrate the values or states of some of the signals that may be formed during the operation of the comparator of FIG. 2 in accordance with the present invention.

FIG. 3 is a graph having plots that illustrate the values or states of some of the signals that may be formed during the operation of comparator 100. The abscissa indicates increasing time and the ordinate indicates increasing value of the illustrated signal. A plot 96 illustrates the value or state of sampling signal 37, and a plot 97 indicates illustrates the value or state of transfer signal 57. A plot 98 illustrates the value or state of control signal 43, and a plot 99 illustrates the value of output transfer signal 72. This description has references to FIG. 2 and FIG. 3.

Comparator 200 may have a conversion procedure that has several phases such as a sample/hold phase, a redistribution phase, a positive feedback (PF) amplification phase, and an output transfer phase. During the sample/hold phase, input signals 31-32 and reference signals 35-36 are sampled and the value is held by comparator 100, such as for example on capacitors 136-143. During the redistribution phase, the stored value of the signals is redistributed between the storing elements, such as for example between capacitors 136-143. During the PF amplification phase, the redistributed value is amplified to form the digital output signals OP and ON.

In operation, assume that at a time t0 signals 37, 57, 43, and 72 are negated, such that input signals IP and IN and reference signals RP and RN are applied to the respective input terminals of switches 38-41. At a time t1, circuit 130 may be configured to sample the value of the input and reference signals. For example, control signal 37 may be asserted closing switches 38-41. Signals 31 and 32 (IP and IN) are applied to the gates of transistor pair 44 and 47 and transistor pair 48 and 51, respectively. Also, signals 35 and 36 (RP and RN) are applied to the gates of transistor pair 59 and 62 and transistor pair 63 and 66, respectively. Capacitors 136 and 137 are charged to substantially the value of signal 31 (IP) and capacitors 138 and 139 are to charge to substantially the value of input signal 32 (IN). Capacitors 140 and 141 are charged to substantially the value of signal 35 (RP) and capacitors 142 and 143 are to charge to substantially the value of signal 36 (RN). Subsequently, signal 37 may be negated thereby storing the value of the input signal on capacitors 136-139 and storing the value of the reference signal on capacitors 140-143, as illustrated by plot 96 prior to time t2.

Capacitors 136, 138, 140, and 142 have one terminal connected to voltage input 25 and capacitors 137, 139, 141, and 143 have one terminal connected to voltage return 26. Thus, when switches 38-41 are enabled or closed, one terminal of capacitors 136-143 receive the corresponding input or reference signal and the other terminal is not floating but is connected to a solid substantially constant source such as the corresponding voltage on input 25 and voltage on return 26. Therefore, each of capacitors 136-143 has a substantially fixed voltage to which the input signal or reference is referenced resulting in a more accurate sampling, thus, storing a more accurate value of the input or reference signal on the capacitors as compared to storing the input signals on capacitors that have a terminal that is floating during the sampling procedure or sampling phase. Additionally, having one terminal connected to the corresponding substantially fixed voltage, such as input 25 or return 26, results in the capacitors having a substantially linear charge curve resulting in storing a more accurate representation of the input signal (31-32) or reference signal (35-36).

Those skilled in the art will appreciate that the value of each capacitor of capacitors 136-143 is formed by the product of the width times the length of the respective transistor of transistors 44, 47, 48, 51, 59, 62, 63, and 66.

Additionally, the load attached to outputs 68 and 69 also forms a capacitor 67 and a capacitor 76 attached to each of outputs 68-69.

Thereafter, comparator 100 may form a redistribution phase of the conversion cycle. For example, at a time t2, transfer signal 57 may be asserted thereby closing or enabling switches 55 and 56. Switch 55 connects the set of capacitors 138 and 139 to the set of capacitors 142 and 143 thereby distributing the charge between the two sets of capacitors, and switch 56 connects the set of capacitors 136 and 137 to the set of capacitors 140 and 141 and distributing the charge between these two sets of capacitors. An embodiment may include that closing switch 55 connects an output 102 of switch 101, in addition to a switched terminal of capacitors 138 and 139, to a switched terminal of capacitors 142 and 143, and to an output 111 of switch 110. Closing switch 56 connects an output 107 of switch 105, in addition to a switched terminal of capacitors 136 and 137, to a switched terminal of capacitors 140 and 141, and to an output 116 of switch 115. The switched terminal of the capacitors may be the terminal that is configured to be switched to different points or terminals in response to a control signal. In an embodiment, the charge may be redistributed according to the equation:

$$Vc = ((Vip*(C136+C137)) - (Vin*(C138+C139)) + \\ (Vrp*(C141+C140)) - (Vrn*(C143+C142)))/ \\ (C136+C137+C138+C139+C140+C141+C142+C143)$$

where:
Vc=the voltage of V68-V69 after charge redistribution and before the RF amplification phase,
CXXX+=the capacitance of the numbered capacitor,
Vip=the amplitude of signal IP,
Vin=the amplitude of signal IN,
(C140-143)=the sum of the capacitances of capacitors 140-143,
Vrp=the amplitude of the voltage RP,
Vrn=the amplitude of the voltage RP.

In an embodiment, capacitors 136-139 are each formed to have a capacitance that is larger than the value of the capacitance of any one of capacitors 140-143. An embodiment may include that capacitors 136-139 are each formed to have a capacitance that is approximately four times larger than the value of the capacitance of any one of capacitors 140-143. In most embodiments, the capacitance of capacitors 136-139 are formed to be larger than the value of any one of capacitors 67 and 76. The larger capacitance of capacitors 136-139 facilitates using a reference voltage value that is lower than the maximum value of the input voltage. In other embodiments the value of capacitors 136-139 may be different.

Comparator 100 may also be configured to form the PF amplification phase of the conversion cycle. Those skilled in the art will appreciate that when inverters 121-122 and inverters 123-124 have the output of each inverter connected to the input of the other inverter, they may be considered as being connected in a positive feedback configuration. Those skilled in the art will also appreciate that the transistors of inverters 121-124 work as a linear amplifier until the input signal is large enough to make the output of the inverters nearly as large as the voltages on either input 25 and return 26, depending on the state of the input, at which time they can be regarded as becoming a digital inverter instead of working as a linear amplifier. Those skilled in the art will also appreciate that when working as the linear amplifier, they are connected in positive feedback configuration. This positive feedback causes the outputs of inverters 121-124 to continue building until one output is pulled up to substantially the voltage on input 25 and the other is pulled to substantially the voltage on return 26. Subsequently, at a time t3 signal 43 may be asserted thereby closing switches 101, 104, 105, 108, 110, 113, 115, and 118 which configures respective inverters 121-124 into an amplifier inverter configuration thereby enabling inverters 121-124 to amplify the signals stored on corresponding capacitors 136-143. In an embodiment, signal 43 may be asserted during a time in which signal 57 is also asserted but a time interval after signal 57 is asserted, as illustrated by plots 97-98. The time interval may allow time for the charge redistribution prior to the PF amplification phase. Thus, comparator 100 may be configured to form the PF amplification phase during a portion of the redistribution phase. Another embodiment may include that the time interval may be omitted and that signal 43 may be asserted substantially simultaneously with signal 57, as illustrated by the dashed portion of plot 98. Thus, comparator 100 may have an embodiment that may be configured to form the PF amplification phase concurrently with the redistribution phase. Another embodiment may be configured to form the PF amplification phase after the redistribution phase is complete, such as for example after signal 57 is negated, as illustrated by a dashed portion 95 of plot 98. Inverters 121-124 subsequently saturate forming either asserted or negated digital signals OP and ON at respective outputs 68-69. Those skilled in the art will appreciate that signals OP and ON may be digital signals with opposite digital values.

Thereafter, an embodiment may include asserting signal 72, such as for example at a time t4, to couple the output signals OP and ON to load such as for example a buffer or driver circuit 75. An embodiment of circuit 75 may include a NAND gate 70 and a NAND gate 71. Gate 70 may have a first input connected to receive signal 72 and a second input connected to receive output signal OP on output 68 and form an output positive (OTP) signal. Similarly, gate 71 may have a first input connected to receive signal 72 and a second input connected to receive output signal ON at output 69 and form an output negative (OTN) signal. Signals OTP and OTN may have an embodiment as digital signals, such as for example digital binary values, with opposite digital values, such as for example opposite digital binary values. Thereafter, signals 57, 43, and 72 may be negated, such as for example a time t5, to complete the conversion process. An embodiment may include that signal 72 is asserted for at least a portion of the interval that signal 43 is asserted as illustrated by plot 99 and the dashed portion of plot 99 which corresponds to dashed portion 95 of plot 98.

The cycle of signals illustrated between times t1-t5 may be repeated to form another conversion cycle for another value of input signals IP and IN such as illustrated at a time t6 and thereafter.

Figure 4:
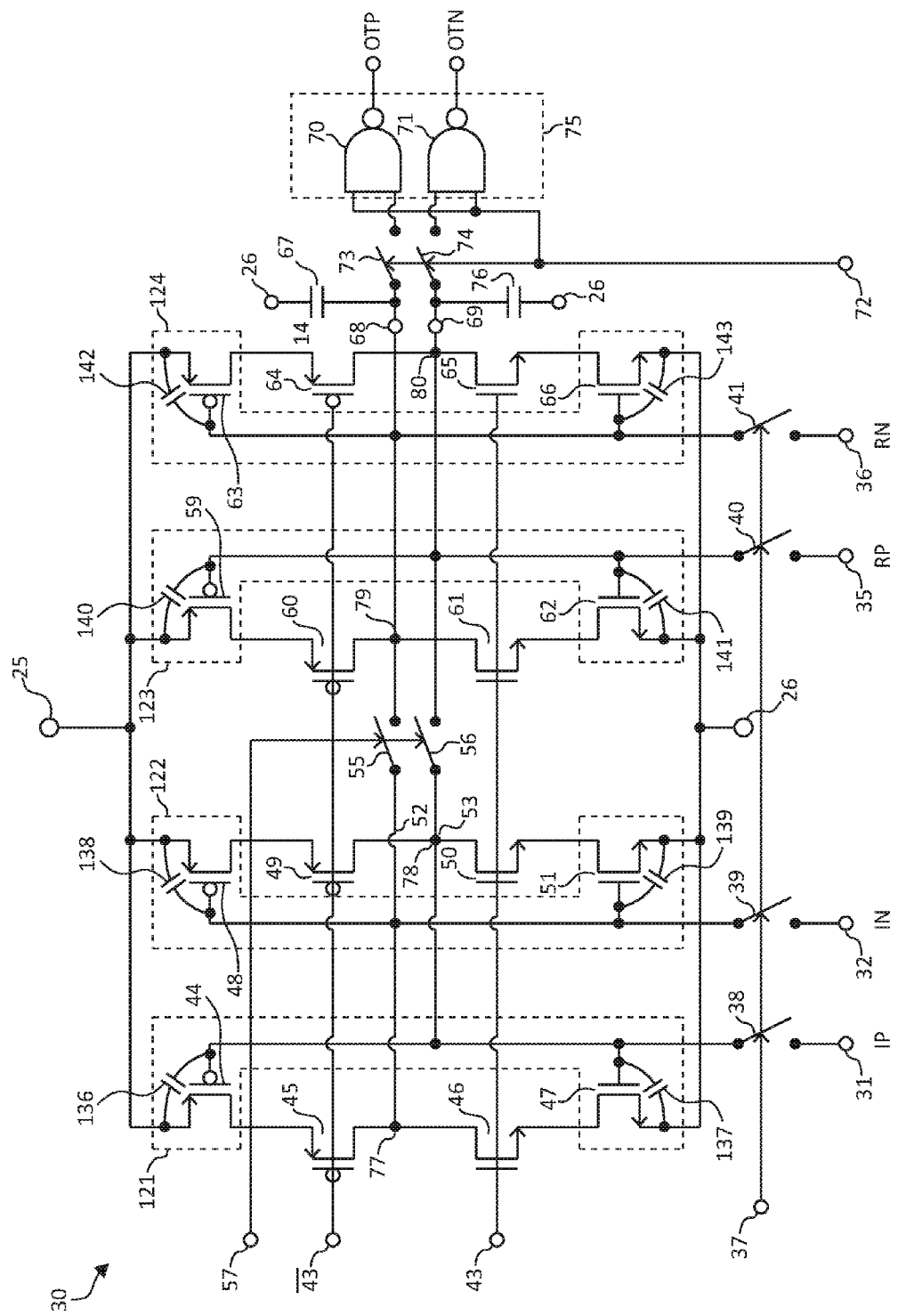
FIG. 4 schematically illustrates an example of an embodiment of a comparator that may be an alternate embodiment of the comparator of FIG. 2 in accordance with the present invention.

FIG. 4 schematically illustrates an example of an embodiment of a comparator 30 that may be an alternate embodiment of comparator 100 that was described in the explanation of FIGS. 2 and 3. Comparator 30 may have an embodiment that may be similar to comparator 100 however switches 101, 105, 110, and 115 are each replaced with a pair of control transistors that function substantially similar to control switches 101, 105, 110, and 115. In an embodiment, a pair of transistors 45 and 46 may be configured to function similarly to switch 101, a pair of transistors 49 and 50 may be configured to function similarly to switch 105, a pair of transistors 60 and 61 may be configured to function similarly to switch 110, and a pair of transistors 64 and 65 may be configured to function similarly to switch 115. Transistors 45 and 46 have an output 77 that may function substantially similar to one or both of outputs 102 and 103 of switch 101 (FIG. 2), output 77 may be formed at a common node between transistors 45 and 46. Similarly, transistors 49 and 50 may have an output 78 that may function substantially similar to one or both of outputs 106 and 107 of switch 105 (FIG. 2), output 78 may be formed at a common node between transistors 49 and 50. Additionally, transistors 60 and 61 may have an output 79 that may function substantially similar to one or both of outputs 111 and 112 of switch 110 (FIG. 2), output 79 may be formed at a common node between transistors 60 and 61. Further, transistors 64 and 65 may have an output 80 that may function substantially similar to one or both of outputs 116 and 117 of switch 115 (FIG. 2), output 80 may be formed at a common node between transistors 64 and 65.

Those skilled in the art will appreciate that asserting signal 43 enables transistor pairs 45 and 46, 49 and 50, 60 and 61, and 64 and 65 thereby configuring respective inverters 121, 122, 123, and 124 into an operational amplifier inverter configuration that selectively configures the upper and lower transistors of each inverter into the amplifier inverter configuration with the upper transistor connected in series with the lower transistor. Additionally, closing switch 55 connects outputs 77 and 79 as described for outputs 102 and 111 (FIG. 2), and closing switch 56 connects outputs 53 and 80 as described for outputs 107 and 116 (FIG. 2). The operation of comparator 30 is substantially similar to the operation of comparator 100 such as the explanation of the signals illustrated in FIG. 3.

In order to facilitate the hereinbefore described configuration and operation, a source of transistor 44 is commonly connected to input 25, and a source of transistors 48, 59, and 63. A source of transistor 47 is commonly connected to return 26, and a source of transistors 51, 62, and 66. A gate of transistor 44 is connected to a gate of transistor 47, and to a first terminal of switch 38. A drain of transistor 44 is connected to a source of transistor 45. A gate of transistor 45 is commonly connected to receive signal 43 and connected to a gate of transistors 46, 49-50, 60-61, and 64-65. A drain of transistor 45 is commonly connected to output 77, a drain of transistor 46, a gate of transistors 48 and 51, to a first terminal of switch 39, and to a first terminal of switch 55. A source of transistor 46 is connected to a drain of transistor 47. A drain of transistor 48 is connected to a source of transistor 49. A drain of transistor 49 is connected to a first terminal of switch 56, to a node or output 53, and to a drain of transistor 50. A source of transistor 50 is connected to a drain of transistor 51. A drain of transistor 59 is connected to a source of transistor 60. A drain of transistor 60 is commonly connected to a node or output 79, a second terminal of switch 55, a drain of transistor 61, output 68, a gate of transistors 63 and 66, and a first terminal of switch 41. A source of transistor 61 is connected to a drain of transistor 62. A gate of transistor 62 is commonly connected to a first terminal of switch 40, a second terminal of switch 56, output 69, a node or output 80, a source of transistor 64, a source of transistor 65, and a gate of transistor 59. A drain of transistor 63 is connected to a source of transistor 64. A source of transistor 65 is connected to a drain of transistor 66. Switches 38-41 have a control electrode connected to receive signal 37, and a second terminal connected to receive respective signals 31, 32, 35, and 36. Switches 73 and 74 have a control electrode connected to receive signal 72. Switch 73 has a first terminal connected to output 68 and a second terminal connected to an input of gate 70. Switch 74 has a first terminal connected to output 69 and a second terminal connected to an input of gate 71.

Figure 5:
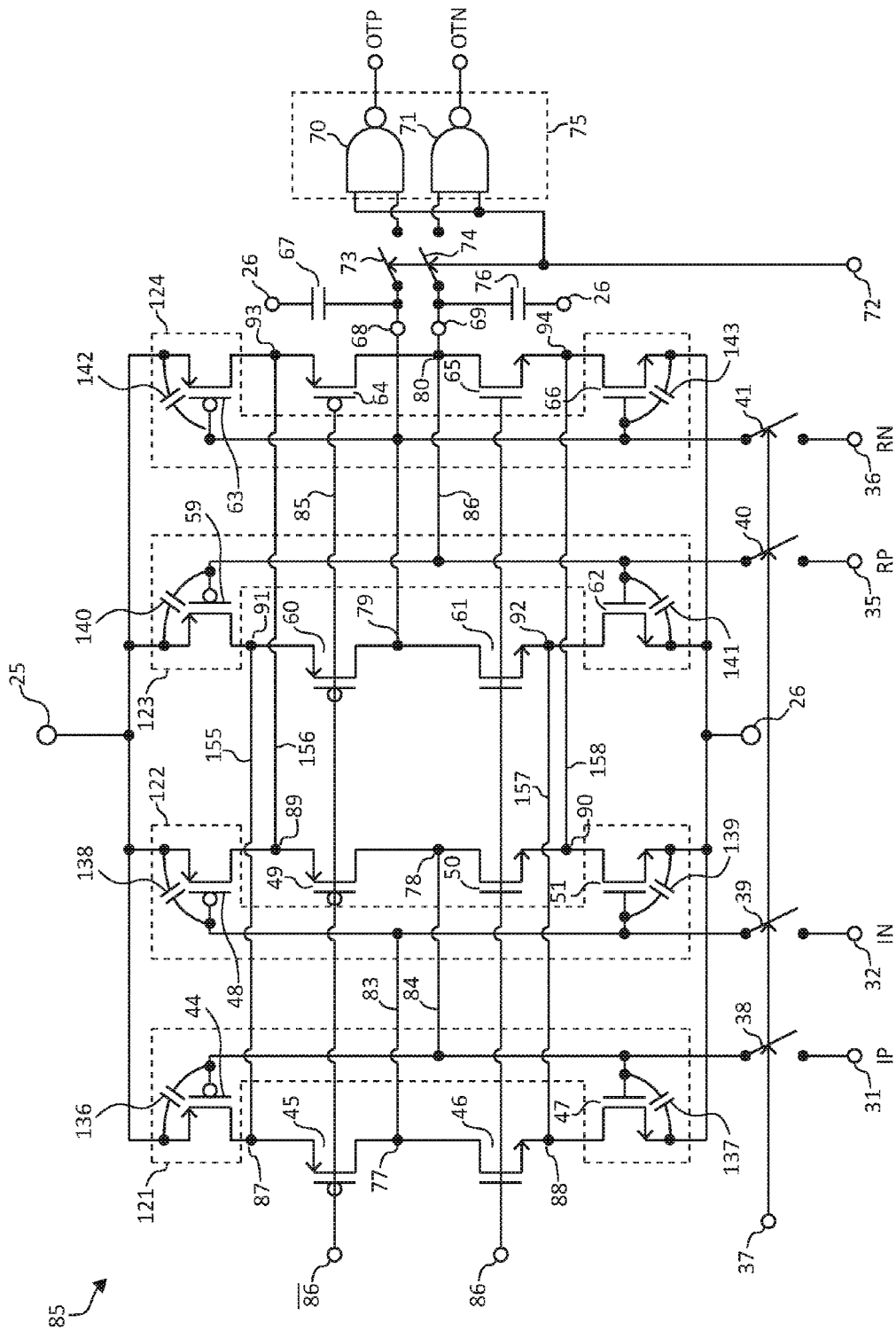
FIG. 5 schematically illustrates an example of an embodiment of a comparator that may be an alternate embodiment of the comparators of FIGS. 2 and 4 in accordance with the present invention.

FIG. 5 schematically illustrates an example of an embodiment of a comparator 85 that may be an alternate embodiment of comparators 30 and/or 100. Comparator 85 is similar to comparator 30 however, switches 55 and 56 are omitted, thus, the connection of outputs 77-80 are slightly different and additional connections are added in other portions of comparator 85. Output 77 of transistors 45 and 46 is connected to the switched terminal of capacitors 138-139, output 78 is connected to the switched terminal of capacitors 136-137, output 79 is connected to the switched terminal of capacitors 142-143, and output 80 is connected to the switched terminal of capacitors 140-141. Additionally, the drain of transistor 44 is connected to the drain of transistor 59 at output 87 and node 91, and the drain of transistor 48 is connected to the drain of transistor 63 at nodes 89 and 93. Also, the drain of transistor 47 is connected to the drain of transistor 62 at nodes 88 and 92, and the drain of transistor 51 is connected to the drain of transistor 66 at nodes 90 and 94.

Additionally, an embodiment of comparator 85 may operate differently than comparators 30 and 100. For example, comparator 85 may operate without signal 57. Also, in an embodiment, control transistors 45 and 46, 49 and 50, 60 and 61, and 64 and 65 are controlled by a control signal 86 that may have different timing than control signal 43 (FIG. 4).

Figure 6:
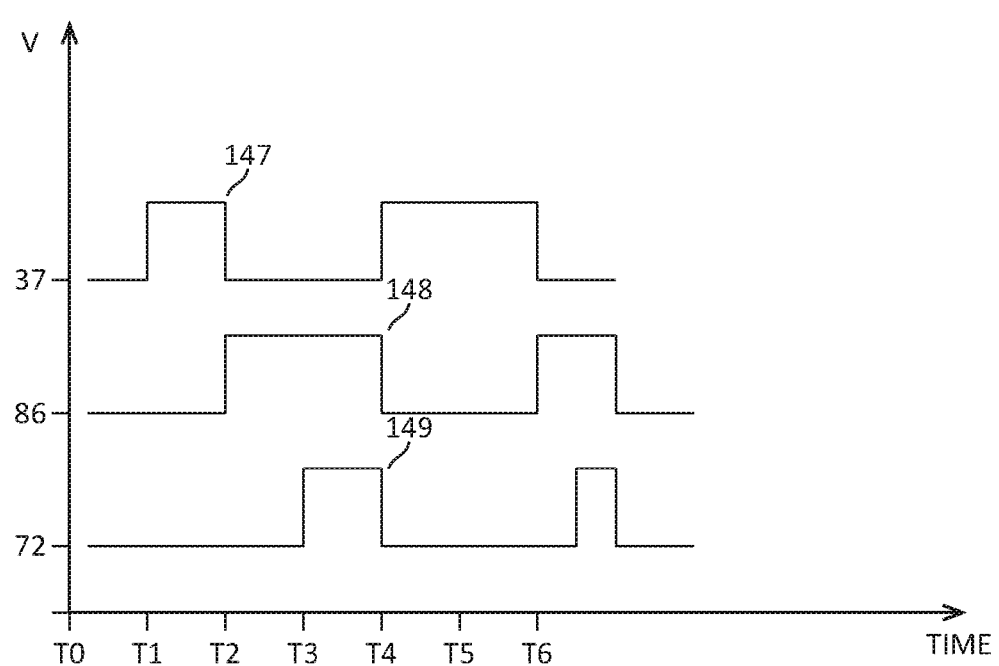
FIG. 6 is a graph having plots that illustrate some of the signals that may be formed during the operation of the comparator of FIG. 5 in accordance with the present invention.

FIG. 6 is a graph having plots that illustrate some of the signals that may be formed during the operation of comparator 85. A plot 147 illustrates signal 37, a plot 148 illustrates signal 86, and a plot 149 illustrates signal 72. The abscissa indicates time and the ordinate indicates increasing value of the illustrated signal. This description has references to FIGS. 5 and 6.

Assume that at a time t0 signals 37, 86 and 72 are negated. Thus, switches 38-41 are disabled, control pairs 45/46, 49/50, 60/61, and 64/65 are also disabled, along with output switches 73 and 74. At a time t1 signal 37 is asserted while signals 86 and 72 remain negated to initiate the sampling phase. Asserting signal 37 selectively couples the input signals IP and IN to respective capacitors 136/138 and 137/139 and selectively couples the reference signals RP and RN to respective capacitors 140-143. Subsequently, signal 37 is negated thereby disabling switches 38-41 and storing the value of the input and reference signals. In an embodiment the input signal is sampled and stored substantially the same as explained for comparator 100 (FIG. 2).

Subsequently, comparator 85 may be configured to operate in a redistribution and PF amplification phase. For example, signal 86 may be asserted, such as for example as illustrated at a time t2, after signal 37 is negated. Asserting signal 86 enables transistor pairs 45 and 46, 49 and 50, 60 and 61, and 64 and 65 and configured amplifier inverters 121-124 to operate as amplifier inverters. Enabling the transistor pairs 45 and 46, 49 and 50, 60 and 61, and 64 and 65 along with connections 83-86 interconnect capacitors 136-143 thereby causing charge sharing between the capacitors as explained by equation (1). For example, enabling transistor 45 may selectively interconnect the switched terminal of capacitors 138 and 139 through connection 83, through transistor 45, through connection 155, through transistor 62, through connection 85, and through transistor 62 to the switched terminal of capacitors 142-143. Additionally, enabling transistor 50 may selectively interconnect the switched terminal of capacitors 136-137 through connection 84, through transistor 50, through connection 158, through enabled transistor 65, and through connection 86 to the switched terminal of capacitors 140-141. Thus, the charge is shared or redistributed. Furthermore, because the control transistors are enabled thereby configuring inverters 121-124 in an operational amplifier inverter configuration, inverters 121-124 amplify the value of the input signal and reference signal that was stored on capacitors 136-143 and soon saturate forming a digital value on outputs 68 and 69.

Subsequently, such as for example at a time t3, output control signal 72 may be asserted during a portion of time that signal 86 is also asserted to couple the differential output signals OP and ON at outputs 68 and 69 to circuit 75 to form the output signals OTP and OTN.

The configuration of comparator 85 facilitates operation using a redistribution and PF amplification phase which allows comparator 85 to convert the differential input signal to the digital output signals faster than circuits that required the separate redistribution phase. Also, comparator 82 has fewer components and interconnections thereby reducing the cost of comparator 82.

In order to facilitate the hereinbefore described configuration and operation, a source of transistor 44 is commonly connected to input 25, and a source of transistors 48, 59, and 63. A source of transistor 47 is commonly connected to return 26, and a source of transistors 51, 62, and 66. A gate of transistor 44 is commonly connected to output 87, a gate of transistor 47, and a first terminal of switch 38. A drain of transistor 44 is commonly connected to a source of transistor 45, a drain of transistor 59, and a source of transistor 60. A gate of transistor 45 is commonly connected to receive signal 86 and to a gate of transistors 46, 49-50, 60-61, and 64-65. A drain of transistor 45 is commonly connected to output 77, a drain of transistor 46, a gate of transistors 48 and 51, and to a first terminal of switch 39. A source of transistor 46 is commonly connected to node 88, a drain of transistor 47, a source of transistor 61, and a drain of transistor 62. A drain of transistor 48 is commonly connected to node 89, a source of transistor 49, node 93, a drain of transistor 63, and a source of transistor 64. Transistor 64 has a drain commonly connected to node 80, output 69, the drain of transistor 65, a gate of transistor 59, a gate of transistor 62, and a first terminal of switch 40. A source of transistor 65 is commonly connected to node 94, a drain of transistor 66, node 90, a drain of transistor 51, and a source of transistor 50. Transistor 49 has a drain connected to output 78 and a drain of transistor 50. Transistor 60 has a drain commonly connected to output 79, a drain of transistor 61, output 68, the gate of transistors 63 and 66, and to a first terminal of switch 41. Switches 38-41 have a control electrode connected to receive signal 37. Switches 73 and 74 have a control electrode connected to receive signal 72, and have a second terminal connected to receive respective signals IP, IN, RP, and RN. Switch 73 has a first terminal connected to output 68 and a second terminal connected to an input of gate 70. Switch 74 has a first terminal connected to output 69 and a second terminal connected to an input of gate 71.

Figure 7:
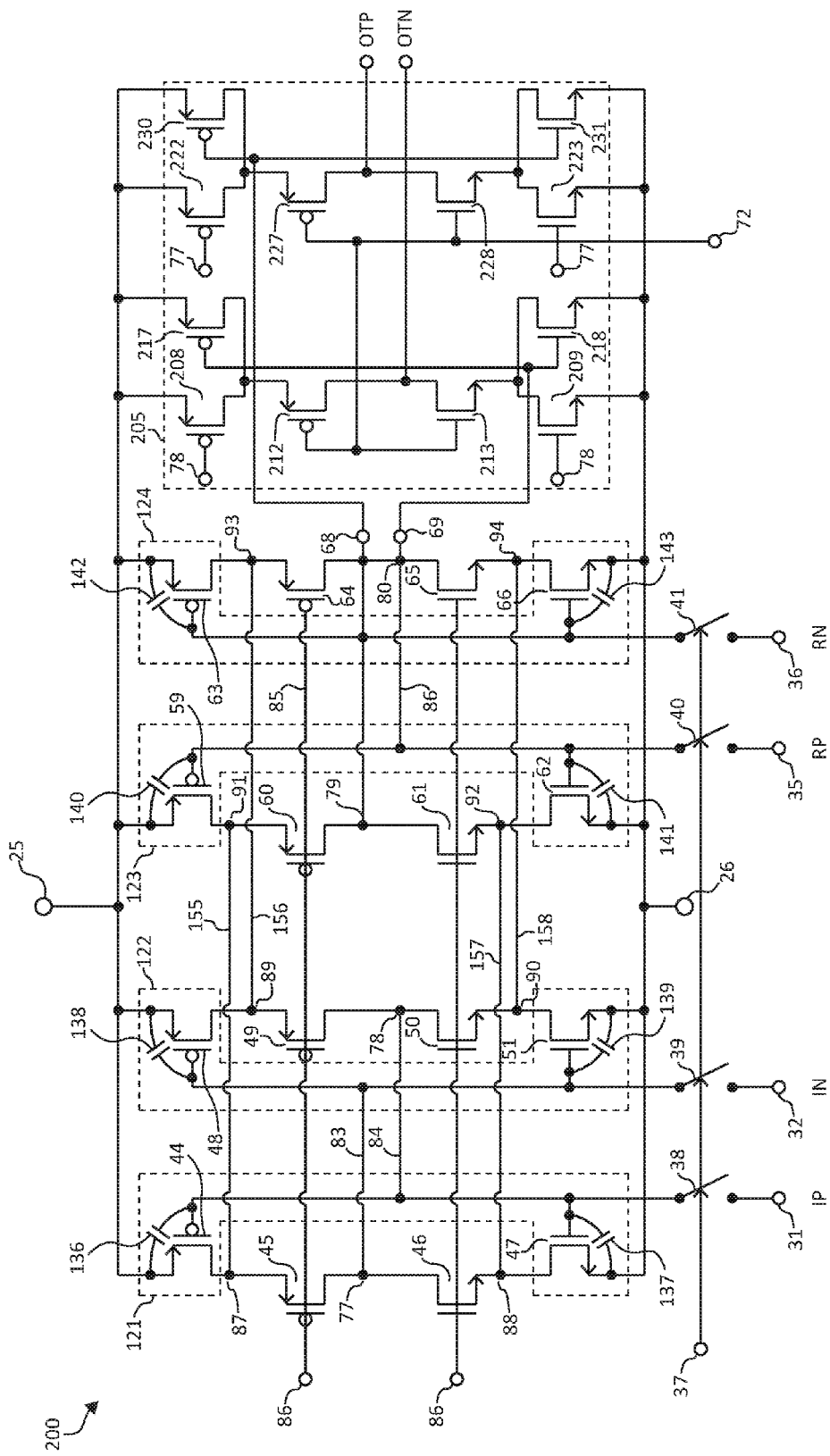
FIG. 7 schematically illustrates an example of an embodiment of a comparator that may be an alternate embodiment of the comparator of FIGS. 5-6 in accordance with the present invention.

FIG. 7 schematically illustrates an example of an embodiment of a comparator 200 that may be an alternate embodiment of comparator 85 that was explained in the description of FIGS. 5-6. Comparator 200 is substantially the same as comparator 85 except that circuit 75 is replaced with a buffer or driver circuit 205.

Comparator 200 includes an upper transistor 208 and a lower transistor 209 that are configured to receive the signal from output 78 from transistor pair 48 and 51. In an embodiment, nodes 78 and 80 should be the same logic level after the PF amplification phase, and nodes 77 and 79 should be the same logic level after the PF amplification phase. In such an embodiment, transistors 208, 209, 217 and 218 function as an inverter. An embodiment of circuit 205 may also include an upper transistor 207 and a lower transistor 218 that are configured to receive the output signal OP from output 68 of comparator 200. In an embodiment, circuit 205 may include an upper transistor 222 and a lower transistor 223 that are configured to receive the signal from output 77 of switch pair 45 and 46. Circuit 205 may have an embodiment that may also include an upper transistor 230 and a lower transistor 231 that are configured to receive the output signal ON from output 69 of comparator 200. Transistors 212 and 213 may, in an embodiment of circuit 205, be configured to selectively couple of transistors 208 and 209 to operate as an amplifier inverter and to configure transistors 217 and 218 to operate as an amplifier inverter in response to an enabled state of signal 72. Circuit 205 may also have an embodiment that includes transistors 227 and 228 configured to selectively couple transistors 222 and 223 to operate as an amplifier inverter and to configure transistors 250 and 251 to operate as an amplifier inverter in response to the enabled state of signal 72.

In operation, comparator 200 operates substantially the same as comparator 85. However, circuit 205 provides a buffer function that minimizes parasitic capacitance affecting the value of capacitors 136-143 thereby resulting in more accurate representation of the value of the input signal (IP/IN).

In the preferred embodiment, transistors 136, 138, 137, 139, 140, 142, 141, 143, 208, 217, 209, 218, 222, 230, 223 and 231 have the same channel length (usually the minimum allowed by the process). The widths are adjusted according to the ratio of capacitance necessary to set the switch point at the desired level. For example, if an embodiment of a ratio between input and reference capacitance is K, then an embodiment may include that the widths is: W136=W138=K*W140=K*W142, and W137=W139=K*W141=K*W143, and W208=W222=K*W217=K*W230, and W209=W223=K*W218=K*W231. If K is a rational number, a person skilled in the art will realize that an embodiment of these transistor widths is to use transistors with multiple segments of equal width. The capacitive load that the buffer puts on the latch stages may be ratioed in the same way that the latches are, so therefore the additional load capacitance does not perturb the switch point.

The voltages on outputs 68 and 69 will be valid logic levels shortly after control signal 86 enables the PF amplification phase. In response to control signal 72 closing switches 73 and 74, NAND gates 71 and 79 invert the signal and pass the signals to OTP and OTN. Either prior to or coincident with signal 37 being asserted, signal 72 is negated in order to minimize current consumption.

In order to facilitate the hereinbefore described functionality, transistors 208, 217, 222, and 250 have a source connected to input 25. Transistor 208 has a drain commonly connected to the drain of transistor 217 and a source of transistor 212. A gate of transistor 208 is commonly connected to the gate of transistor 209 and to output 78 of transistor pair 49 and 50. A gate of transistor 212 is commonly connected to a gate of transistor 218 and to output 69. A drain of transistor 212 is commonly connected to a drain of transistor 213 and to provide output signal OTN. A gate of transistor 212 is commonly connected to the gate of transistor 213, the gate of transistor 227, the gate of transistor 228, and to receive signal 72. The source of transistor 213 is commonly connected to the drain of transistor 209 and the drain of transistor 218. The source of transistor 218 is commonly connected to the drain of transistor 209, the drain of transistor 223, the drain of transistor 231, and to return 26. A gate of transistor 222 is commonly connected to a gate of transistor 223 and to output 77 of transistor pair 45 and 46. A drain of transistor 222 is commonly connected to a drain of transistor 250 and a source of transistor 227. A drain of transistor 227 is commonly connected to a drain of transistor 228 and to the output to provide output signal OTP. A source of transistor 228 is commonly connected to a drain of transistor 223 and a drain of transistor 251. A gate of transistor 251 is commonly connected to a gate of transistor 250 and to output 68.

Figure 8:
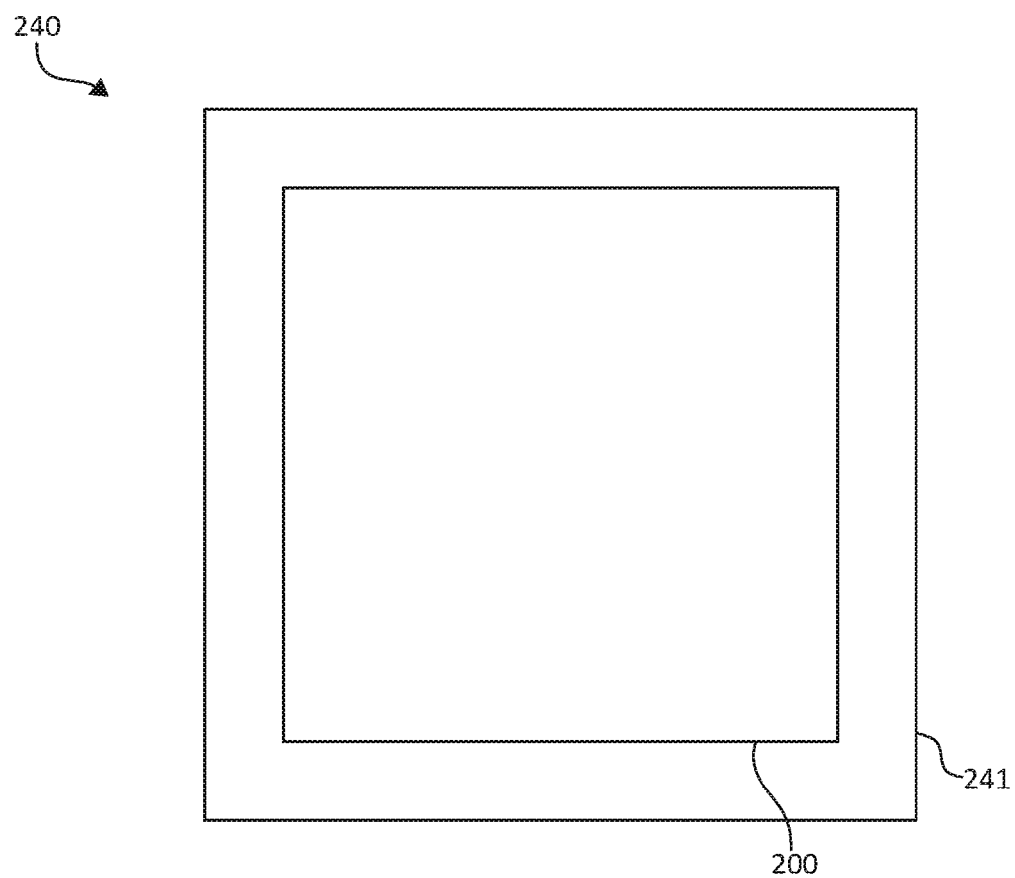
FIG. 8 illustrates an enlarged plan view of a semiconductor device that includes the comparator of any one of FIGS. 2, 4-5, and 7 in accordance with the present invention.

FIG. 8 illustrates an enlarged plan view of a portion of an embodiment of a semiconductor device or integrated circuit 240 that is formed on a semiconductor die 241. In an embodiment, any one of comparators 30, 85, 100, and/or 200 may be formed on die 241. Die 241 may also include other circuits that are not shown in FIG. 7 for simplicity of the drawing. The comparator and device or integrated circuit 240 may be formed on die 241 by semiconductor manufacturing techniques that are well known to those skilled in the art.

From all the foregoing, those skilled in the art will appreciate that an example of an embodiment of a comparator latch of a semiconductor device may comprise, a first transistor, such as for example transistor 44, of a first selectively switched inverter, such as for example inverter 121, having a first current carrying electrode coupled to directly receive a voltage from a voltage supply input, such as for example input 25, of the comparator latch, the first transistor of the first selectively switched inverter having a control electrode coupled to receive a first input signal, the first transistor of the first selectively switched inverter also having a second current carrying electrode;

a second transistor, such as for example transistor 47, of the first selectively switched inverter having a first current carrying electrode coupled to directly receive a voltage from a voltage return input, such as for example input 26, of the comparator latch, the second transistor of the first selectively switched inverter having a control electrode coupled to receive the first input signal, the second transistor of the first selectively switched inverter also having a second current carrying electrode;

a first selectively enabled control switch, such as for example switch 101 or transistors 45-46, having a first terminal coupled to the second current carrying electrode of the first transistor of the first selectively switched inverter, a second terminal coupled to the second current carrying electrode of the second transistor of the first selectively switched inverter, and a control electrode coupled to receive a first clock signal, such as for example signal 43;

a first transistor, such as for example transistor 48 of a second selectively switched inverter, such as for example inverter 122, having a first current carrying electrode coupled to directly receive the voltage from the voltage supply input of the comparator latch, the first transistor of the second selectively switched inverter having a control electrode coupled to receive a second input signal that has substantially the same amplitude as the first input signal but has a substantially opposite polarity to the first input signal, the first transistor of the second selectively switched inverter also having a second current carrying electrode;

a second transistor, such as for example transistor 51, of the second selectively switched inverter having a first current carrying electrode coupled to directly receive the voltage from the voltage return input of the comparator latch, the second transistor of the second selectively switched inverter having a control electrode coupled to receive the second input signal, the second transistor of the second selectively switched inverter also having a second current carrying electrode; and a second selectively enabled control switch, such as for example switch 105 or transistors 49-50, having a first terminal coupled to the second current carrying electrode of the first transistor of the second selectively switched inverter, a second terminal coupled to the second current carrying electrode of the second transistor of the second selectively switched inverter, and a control electrode coupled to receive the first clock signal.

An embodiment of the comparator latch may also include a first transfer switch, such as for example switch 55, having a first terminal coupled to the control electrode of the first and second transistors of the second selectively switched inverter and to the second current carrying electrode of one of the first or second transistors of the first selectively switched inverter, the first transfer switch having a control electrode coupled to receive a second clock signal, such as for example signal 57, and having a second terminal.

In an embodiment, the comparator latch may also include a second transfer switch, such as for example switch 56 having a first terminal coupled to the control electrode of the first and second transistors of the first selectively switched inverter and to the second current carrying electrode of one of the first or second transistors of the second selectively switched inverter, the second transfer switch having a control electrode coupled to receive the second clock signal, and having a second terminal.

An embodiment may also include a first transistor, such as for example transistor 59, of a third selectively switched inverter, such as for example inverter 123, having a first current carrying electrode coupled to directly receive the voltage from the voltage supply input of the comparator latch, the first transistor of the third selectively switched inverter having a control electrode coupled to receive a first reference signal, the first transistor of the third selectively switched inverter also having a second current carrying electrode;

a second transistor, such as for example transistor 62, of the third selectively switched inverter having a first current carrying electrode coupled to directly receive the voltage from the voltage return input of the comparator latch, the second transistor of the third selectively switched inverter having a control electrode coupled to receive the first reference signal, the second transistor of the third selectively switched inverter also having a second current carrying electrode; and a third selectively enabled control switch, such as for example switch 110 or transistors 60-61, having a first terminal coupled to the second current carrying electrode of the first transistor of the third selectively switched inverter, a second terminal coupled to the second current carrying electrode of the second transistor of the third selectively switched inverter, and a control electrode coupled to receive the first clock signal.

Another embodiment may also include a first transistor, such as for example transistor 63, of a fourth selectively switched inverter, such as for example inverter 124, having a first current carrying electrode coupled to directly receive the voltage from the voltage supply input of the comparator latch, the first transistor of the fourth selectively switched inverter having a control electrode coupled to receive a second reference signal that has substantially the same amplitude as the first reference signal but has a substantially opposite polarity to the first reference signal, the first transistor of the fourth selectively switched inverter also having a second current carrying electrode;

a second transistor, such as for example transistor 65, of the fourth selectively switched inverter having a first current carrying electrode coupled to directly receive the voltage from the voltage return input of the comparator latch, the second transistor of the fourth selectively switched inverter having a control electrode coupled to receive the second reference signal, the second transistor of the fourth selectively switched inverter also having a second current carrying electrode;

a fourth selectively enabled control switch, such as for example switch 124 or transistors 64-65, having a first terminal coupled to the second current carrying electrode of the first transistor of the fourth selectively switched inverter, a second terminal coupled to the second current carrying electrode of the second transistor of the fourth selectively switched inverter, and a control electrode coupled to receive the first clock signal.

An embodiment may also include that the second current carrying electrode of the first transistor of the first selectively switched inverter may be connected to the second current carrying electrode of the first transistor of the third selectively switched inverter, and the second current carrying electrode of the second transistor of the first selectively switched inverter may be connected to the second current carrying electrode of the second transistor of the third selectively switched inverter.

In another embodiment, the comparator latch may also include that the second current carrying electrode of the first transistor of the second selectively switched inverter may be connected to the second current carrying electrode of the first transistor of the fourth selectively switched inverter, and the second current carrying electrode of the second transistor of the second selectively switched inverter may be connected to the second current carrying electrode of the second transistor of the fourth selectively switched inverter.

An embodiment may also include a first transfer switch, such as for example switch 55, having a first terminal coupled to the control electrode of the first and second transistors of the second selectively switched inverter and to the second current carrying electrode of one of the first or second transistors of the first selectively switched inverter, the first transfer switch having a control electrode coupled to receive a second clock signal, and having a second terminal coupled to the control electrode of the first and second transistors of the fourth selectively switched inverter and to the second current carrying electrode of one of the first or second transistors of the third selectively switched inverter.

An embodiment may also include a second transfer switch, such as for example switch 56, having a first terminal coupled to the control electrode of the first and second transistors of the first selectively switched inverter and to the second current carrying electrode of one of the first or second transistors of the second selectively switched inverter, the second transfer switch having a control electrode coupled to receive the second clock signal, and having a second terminal coupled to the control electrode of the first and second transistors of the third selectively switched inverter and to the second current carrying electrode of one of the first or second transistors of the fourth selectively switched inverter.

In an embodiment, the first and second input signals and the first and second reference signals are selectively coupled to the comparator latch in response to a second clock signal, such as for example signal 37.

In an embodiment, the first selectively enabled control switch includes first and second control transistors, such as for example transistors 45 and 46, coupled together in series with a first current carrying electrode of the first and second control transistors connected together, a second current carrying electrode of the first control transistor, such as for example transistor 45, connected to the second current carrying electrode of the first transistor of the first selectively switched inverter, and a second current carrying electrode of the second control transistor connected to the second current carrying electrode of the second transistor of the first selectively switched inverter.

An embodiment may include that the second selectively enabled control switch may include third and fourth control transistors, such as for example transistors 49 and 50, coupled together in series with a first current carrying electrode of the third and fourth control transistors connected together, a second current carrying electrode of the third control transistor connected to the second current carrying electrode of the first transistor of the second selectively switched inverter, and a second current carrying electrode of the fourth control transistor connected to the second current carrying electrode of the second transistor of the second selectively switched inverter.

An embodiment may also include a buffer circuit, such as for example circuit 205, on outputs of the comparator latch wherein the buffer circuit substantially isolates capacitors on the control electrodes of the first and second selectively switched inverters from external parasitic capacitances.

Another embodiment may also include that a first output switch, such as for example switch 68, may have a first terminal coupled to the control electrode of the first and second transistors of the fourth selectively switched inverter, and a second output switch having a first terminal coupled to the control electrode of the first and second transistors of the third selectively switched inverter.

Those skilled in the art will also appreciate that a method of forming a semiconductor device may comprise:

forming a first inverter and a second inverter, such as for example inverters 121-122, to selectively receive separate inputs of a differential input signal, such as for example the signals on inputs 31 and 32;

directly connecting each of the first and second inverters to receive power directly from a voltage input, as for example input 25, and a voltage return, such as for example return 26;

configuring the first inverter to include a first control switch, such as for example switch 101 or transistors 45-46, that is configured to selectively couple together an upper transistor, such as for example transistor 44, and a lower transistor, such as for example transistor 47, of the first inverter;

configuring the second inverter to include a second control switch, such as for example switch 105 or transistors 49-50, that is configured to selectively couple together an upper transistor, such as for example transistor 48, and a lower transistor, such as for example transistor 51, of the second inverter;

coupling an output, such as for example output 77, of the first control switch to a control electrode of the upper and lower transistors of the second inverter; and coupling an output of the second control switch to a control electrode of the upper and lower transistors of the first inverter.

The method may also have an embodiment that may include forming a third inverter and a fourth inverter, such as for example inverters 123-124, to selectively receive separate inputs of a differential reference signal, such as for example the signal on inputs 35 and 36;

directly connecting each of the third and fourth inverters to receive power directly from the voltage input and the voltage return;

configuring the third inverter to include a third control switch, such as for example switch 110 or transistors 60-61, that is configured to selectively couple together an upper transistor, such as for example transistor 59, and a lower transistor, such as for example transistor 62, of the third inverter;

configuring the fourth inverter to include a fourth control switch, such as for example switch 115 or transistors 64-65, that is configured to selectively couple together an upper transistor, such as for example transistor 64, and a lower transistor, such as for example transistor 65, of the fourth inverter;

coupling an output, such as for example output 79 of the third control switch to a control electrode of the upper and lower transistors of the fourth inverter; and coupling an output, such as for example output 80, of the fourth control switch to a control electrode of the upper and lower transistors of the third inverter.

An embodiment of the method may also include forming the first inverter and the second inverter to selectively receive the differential input signal in response to a first timing signal.

The method may also include connecting outputs, such as for example outputs 87-88, of the first inverter to outputs, such as for example output 91-92, of the third inverter, and connecting outputs, such as for example outputs 89-90, of the second inverter to outputs of the fourth inverter, such as for example outputs 93-94.

Those skilled in the art will also understand that a semiconductor device may comprise:

a first transistor, such as for example transistor 44, of a first selectively switched inverter, such as for example inverter 121, having a first current carrying electrode coupled to directly receive a voltage from a voltage supply input, such as for example input 25, of the comparator latch, the first transistor of the first selectively switched inverter having a control electrode coupled to selectively receive a first input signal, the first transistor of the first selectively switched inverter also having a second current carrying electrode;

a second transistor, such as for example transistor 47, of the first selectively switched inverter, such as for example inverter 121, having a first current carrying electrode coupled to directly receive a voltage from a voltage return input, such as for example input 26, of the comparator latch, the second transistor of the first selectively switched inverter having a control electrode coupled to selectively receive the first input signal, the second transistor of the first selectively switched inverter also having a second current carrying electrode;

a first selectively enabled control switch, such as for example switch 101 or transistors 45-46, having a first terminal coupled to the second current carrying electrode of the first transistor of the first selectively switched inverter, a second terminal coupled to the second current carrying electrode of the second transistor of the first selectively switched inverter, and a control electrode coupled to receive a first clock signal, such as for example signal 43;

a first transistor, such as for example transistor 59, of a second selectively switched inverter, such as for example inverter 123, having a first current carrying electrode coupled to directly receive the voltage from the voltage supply input of the comparator latch, the first transistor of the second selectively switched inverter having a control electrode coupled to selectively receive a first reference signal, such as for example this reference signal received on input 35, the first transistor of the second selectively switched inverter also having a second current carrying electrode connected to the second current carrying electrode of the first transistors of the first selectively switched inverter;

a second transistor, such as for example transistor 62, of the second selectively switched inverter having a first current carrying electrode coupled to directly receive the voltage from the voltage return input of the comparator latch, the second transistor of the second selectively switched inverter having a control electrode coupled to receive the first reference signal, the second transistor of the second selectively switched inverter also having a second current carrying electrode connected to the second current carrying electrode of the second transistor of the first selectively switched inverter; and a second selectively enabled control switch, such as for example switch 110 or transistors 60-61, having a first terminal coupled to the second current carrying electrode of the first transistor of the second selectively switched inverter, a second terminal coupled to the second current carrying electrode of the second transistor of the second selectively switched inverter, and a control electrode coupled to receive the first clock signal.

Another embodiment may also include a first transistor, such as for example transistor 48, of a third selectively switched inverter, such as for example inverter 122, having a first current carrying electrode coupled to directly receive the voltage from the voltage supply input of the comparator latch, the first transistor of the third selectively switched inverter having a control electrode coupled to selectively receive a second input signal, such as for example the signal on input 32, that has substantially the same amplitude as the first input signal but has a substantially opposite polarity, the first transistor of the third selectively switched inverter also having a second current carrying electrode;

a second transistor, such as for example transistor 62, of the third selectively switched inverter having a first current carrying electrode coupled to directly receive the voltage from the voltage return input of the comparator latch, the second transistor of the third selectively switched inverter having a control electrode coupled to receive the second input signal, the second transistor of the third selectively switched inverter also having a second current carrying electrode; and a third selectively enabled control switch, such as for example switch 105 or transistors 49-50, having a first terminal coupled to the second current carrying electrode of the first transistor of the third selectively switched inverter, a second terminal coupled to the second current carrying electrode of the second transistor of the third selectively switched inverter, and a control electrode coupled to receive the first clock signal, the third selectively enabled control switch having an output connected to the control electrode of the first and second transistors of the first selectively enabled inverter; and the first selectively enabled control switch having an output connected to the control electrode of the first and second transistors of the third selectively enabled inverter.

In another embodiment may also include a buffer circuit, such as for example circuit 205, on outputs of the comparator latch wherein the buffer circuit substantially isolates capacitors on the control electrodes of the first and second selectively switched inverters from external parasitic capacitances.

In view of all of the above, it is evident that a novel device and method is disclosed. Included, among other features, is forming an embodiment of a comparator to store values of an input signal on a capacitor that has one terminal connected to a stable, or alternately fixed, voltage value with another terminal of the capacitor configured to selectively receive the value of the input signal. An embodiment may include forming a comparator to operate with only two phases, a sampling phase and a combined redistribution/PF amplification phase. A separate third phase may, in an embodiment, be used to transfer the output signal to a buffer or driver circuit.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope. It is evident that many alternatives and variations will be apparent to those skilled in the art. As will be appreciated by those skilled in the art, the example form of comparators 30, 85, 100, and are used as a vehicle to explain the structure and operation of the comparator. Those skilled in the art will appreciate that the logic gates may be other types of gates such as OR, NOR, AND, etc. and that some of the switches may be have alternate embodiments as PMOS or NMOS transistors. Additionally, switches 38-41 and 73-74 may have alternate embodiments of CMOS transistors, such as for example a PMOS transistor in parallel with an NMOS transistor, Additionally, gates 70 and 71 may each have an alternate embodiment as a latch so the output signals are held while the next input is processed.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A comparator latch of a semiconductor device comprising:
a first transistor of a first selectively switched inverter having a first current carrying electrode coupled to directly receive a voltage from a voltage supply input of the comparator latch, the first transistor of the first selectively switched inverter having a control electrode coupled to receive a first input signal, the first transistor of the first selectively switched inverter also having a second current carrying electrode;
a second transistor of the first selectively switched inverter having a first current carrying electrode coupled to directly receive a voltage from a voltage return input of the comparator latch, the second transistor of the first selectively switched inverter having a control electrode coupled to receive the first input signal, the second transistor of the first selectively switched inverter also having a second current carrying electrode;
a first selectively enabled control switch having a first terminal coupled to the second current carrying electrode of the first transistor of the first selectively switched inverter, a second terminal coupled to the second current carrying electrode of the second transistor of the first selectively switched inverter, and a control electrode coupled to receive a first clock signal;
a first transistor of a second selectively switched inverter having a first current carrying electrode coupled to directly receive the voltage from the voltage supply input of the comparator latch, the first transistor of the second selectively switched inverter having a control electrode coupled to receive a second input signal that has substantially the same amplitude as the first input signal but has a substantially opposite polarity to the first input signal, the first transistor of the second selectively switched inverter also having a second current carrying electrode;
a second transistor of the second selectively switched inverter having a first current carrying electrode coupled to directly receive the voltage from the voltage return input of the comparator latch, the second transistor of the second selectively switched inverter having a control electrode coupled to receive the second input signal, the second transistor of the second selectively switched inverter also having a second current carrying electrode; and
a second selectively enabled control switch having a first terminal coupled to the second current carrying electrode of the first transistor of the second selectively switched inverter, a second terminal coupled to the second current carrying electrode of the second transistor of the second selectively switched inverter, and a control electrode coupled to receive the first clock signal.

2. The comparator latch of claim 1 further including a first transfer switch having a first terminal coupled to the control electrode of the first and second transistors of the second selectively switched inverter and to the second current carrying electrode of one of the first or second transistors of the first selectively switched inverter, the first transfer switch having a control electrode coupled to receive a second clock signal, and having a second terminal.

3. The comparator latch of claim 2 further including a second transfer switch having a first terminal coupled to the control electrode of the first and second transistors of the first selectively switched inverter and to the second current carrying electrode of one of the first or second transistors of the second selectively switched inverter, the second transfer switch having a control electrode coupled to receive the second clock signal, and having a second terminal.

4. The comparator latch of claim 1 further including a first transistor of a third selectively switched inverter having a first current carrying electrode coupled to directly receive the voltage from the voltage supply input of the comparator latch, the first transistor of the third selectively switched inverter having a control electrode coupled to receive a first reference signal, the first transistor of the third selectively switched inverter also having a second current carrying electrode;
a second transistor of the third selectively switched inverter having a first current carrying electrode coupled to directly receive the voltage from the voltage return input of the comparator latch, the second transistor of the third selectively switched inverter having a control electrode coupled to receive the first reference signal, the second transistor of the third selectively switched inverter also having a second current carrying electrode; and
- a third selectively enabled control switch having a first terminal coupled to the second current carrying electrode of the first transistor of the third selectively switched inverter, a second terminal coupled to the second current carrying electrode of the second transistor of the third selectively switched inverter, and a control electrode coupled to receive the first clock signal.

5. The comparator latch of claim 4 further including a first transistor of a fourth selectively switched inverter having a first current carrying electrode coupled to directly receive the voltage from the voltage supply input of the comparator latch, the first transistor of the fourth selectively switched inverter having a control electrode coupled to receive a second reference signal that has substantially the same amplitude as the first reference signal but has a substantially opposite polarity to the first reference signal, the first transistor of the fourth selectively switched inverter also having a second current carrying electrode;
- a second transistor of the fourth selectively switched inverter having a first current carrying electrode coupled to directly receive the voltage from the voltage return input of the comparator latch, the second transistor of the fourth selectively switched inverter having a control electrode coupled to receive the second reference signal, the second transistor of the fourth selectively switched inverter also having a second current carrying electrode;
- a fourth selectively enabled control switch having a first terminal coupled to the second current carrying electrode of the first transistor of the fourth selectively switched inverter, a second terminal coupled to the second current carrying electrode of the second transistor of the fourth selectively switched inverter, and a control electrode coupled to receive the first clock signal.

6. The comparator latch of claim 5 further including a first transfer switch having a first terminal coupled to the control electrode of the first and second transistors of the second selectively switched inverter and to the second current carrying electrode of one of the first or second transistors of the first selectively switched inverter, the first transfer switch having a control electrode coupled to receive a second clock signal, and having a second terminal coupled to the control electrode of the first and second transistors of the fourth selectively switched inverter and to the second current carrying electrode of one of the first or second transistors of the third selectively switched inverter.

7. The comparator latch of claim 6 further including a second transfer switch having a first terminal coupled to the control electrode of the first and second transistors of the first selectively switched inverter and to the second current carrying electrode of one of the first or second transistors of the second selectively switched inverter, the second transfer switch having a control electrode coupled to receive the second clock signal, and having a second terminal coupled to the control electrode of the first and second transistors of the third selectively switched inverter and to the second current carrying electrode of one of the first or second transistors of the fourth selectively switched inverter.

8. The comparator latch of claim 4 further including the second current carrying electrode of the first transistor of the first selectively switched inverter connected to the second current carrying electrode of the first transistor of the third selectively switched inverter, and the second current carrying electrode of the second transistor of the first selectively switched inverter connected to the second current carrying electrode of the second transistor of the third selectively switched inverter.

9. The comparator latch of claim 8 further including the second current carrying electrode of the first transistor of the second selectively switched inverter connected to the second current carrying electrode of the first transistor of the fourth selectively switched inverter, and the second current carrying electrode of the second transistor of the second selectively switched inverter connected to the second current carrying electrode of the second transistor of the fourth selectively switched inverter.

10. The comparator latch of claim 1 wherein the first and second input signals and the first and second reference signals are selectively coupled to the comparator latch in response to a second clock signal.

11. The comparator latch of claim 1 wherein the first selectively enabled control switch includes first and second control transistors coupled together in series with a first current carrying electrode of the first and second control transistors connected together, a second current carrying electrode of the first control transistor connected to the second current carrying electrode of the first transistor of the first selectively switched inverter, and a second current carrying electrode of the second control transistor connected to the second current carrying electrode of the second transistor of the first selectively switched inverter.

12. The comparator latch of claim 11 wherein the second selectively enabled control switch includes third and fourth control transistors coupled together in series with a first current carrying electrode of the third and fourth control transistors connected together, a second current carrying electrode of the third control transistor connected to the second current carrying electrode of the first transistor of the second selectively switched inverter, and a second current carrying electrode of the fourth control transistor connected to the second current carrying electrode of the second transistor of the second selectively switched inverter.

13. The comparator latch of claim 1 further including a buffer circuit on outputs of the comparator latch wherein the buffer circuit substantially isolates capacitors on the control electrodes of the first and second selectively switched inverters from external parasitic capacitances.

14. A method of forming a semiconductor device comprising:
- forming a first inverter and a second inverter to selectively receive separate inputs of a differential input signal;
- directly connecting each of the first and second inverters to receive power directly from a voltage input and a voltage return;
- configuring the first inverter to include a first control switch that is configured to selectively couple together an upper transistor and a lower transistor of the first inverter;
- configuring the second inverter to include a second control switch that is configured to selectively couple together an upper transistor and a lower transistor of the second inverter;
- coupling an output of the first control switch to a control electrode of the upper and lower transistors of the second inverter; and coupling an output of the second control switch to a control electrode of the upper and lower transistors of the first inverter.

15. The method of claim 14 further including forming a third inverter and a fourth inverter to selectively receive separate inputs of a differential reference signal;
   directly connecting each of the third and fourth inverters to receive power directly from the voltage input and the voltage return;
   configuring the third inverter to include a third control switch that is configured to selectively couple together an upper transistor and a lower transistor of the third inverter;
   configuring the fourth inverter to include a fourth control switch that is configured to selectively couple together an upper transistor and a lower transistor of the fourth inverter;
   coupling an output of the third control switch to a control electrode of the upper and lower transistors of the fourth inverter; and
   coupling an output of the fourth control switch to a control electrode of the upper and lower transistors of the third inverter.

16. The method of claim 14 wherein forming the first inverter and the second inverter to selectively receive separate inputs of the differential input signal includes forming the first inverter and the second inverter selectively receive the differential input signal in response to a first timing signal.

17. The method of claim 14 further including connecting outputs of the first inverter to outputs of the third inverter, and connecting outputs of the second inverter to outputs of the fourth inverter.

18. A semiconductor device comprising:
   a first transistor of a first selectively switched inverter having a first current carrying electrode coupled to directly receive a voltage from a voltage supply input of the comparator latch, the first transistor of the first selectively switched inverter having a control electrode coupled to selectively receive a first input signal, the first transistor of the first selectively switched inverter also having a second current carrying electrode;
   a second transistor of the first selectively switched inverter having a first current carrying electrode coupled to directly receive a voltage from a voltage return input of the comparator latch, the second transistor of the first selectively switched inverter having a control electrode coupled to selectively receive the first input signal, the second transistor of the first selectively switched inverter also having a second current carrying electrode;
   a first selectively enabled control switch having a first terminal coupled to the second current carrying electrode of the first transistor of the first selectively switched inverter, a second terminal coupled to the second current carrying electrode of the second transistor of the first selectively switched inverter, and a control electrode coupled to receive a first clock signal;
   a first transistor of a second selectively switched inverter having a first current carrying electrode coupled to directly receive the voltage from the voltage supply input of the comparator latch, the first transistor of the second selectively switched inverter having a control electrode coupled to selectively receive a first reference signal, the first transistor of the second selectively switched inverter also having a second current carrying electrode connected to the second current carrying electrode of the first transistors of the first selectively switched inverter;
   a second transistor of the second selectively switched inverter having a first current carrying electrode coupled to directly receive the voltage from the voltage return input of the comparator latch, the second transistor of the second selectively switched inverter having a control electrode coupled to receive the first reference signal, the second transistor of the second selectively switched inverter also having a second current carrying electrode connected to the second current carrying electrode of the second transistor of the first selectively switched inverter; and
   a second selectively enabled control switch having a first terminal coupled to the second current carrying electrode of the first transistor of the second selectively switched inverter, a second terminal coupled to the second current carrying electrode of the second transistor of the second selectively switched inverter, and a control electrode coupled to receive the first clock signal.

19. The semiconductor device of claim 18 further including a first transistor of a third selectively switched inverter having a first current carrying electrode coupled to directly receive the voltage from the voltage supply input of the comparator latch, the first transistor of the third selectively switched inverter having a control electrode coupled to selectively receive a second input signal that has substantially the same amplitude as the first input signal but has a substantially opposite polarity, the first transistor of the third selectively switched inverter also having a second current carrying electrode;
   a second transistor of the third selectively switched inverter having a first current carrying electrode coupled to directly receive the voltage from the voltage return input of the comparator latch, the second transistor of the third selectively switched inverter having a control electrode coupled to receive the second input signal, the second transistor of the third selectively switched inverter also having a second current carrying electrode; and
   a third selectively enabled control switch having a first terminal coupled to the second current carrying electrode of the first transistor of the third selectively switched inverter, a second terminal coupled to the second current carrying electrode of the second transistor of the third selectively switched inverter, and a control electrode coupled to receive the first clock signal, the third selectively enabled control switch having an output connected to the control electrode of the first and second transistors of the first selectively enabled inverter; and
   the first selectively enabled control switch having an output connected to the control electrode of the first and second transistors of the third selectively enabled inverter.

20. The comparator latch of claim 18 further including a buffer circuit on outputs of the comparator latch wherein the buffer circuit substantially isolates capacitors on the control electrodes of the first and second selectively switched inverters from external parasitic capacitances.

* * * * *